HIGH POWER SEMICONDUCTOR CONTROL ELEMENT
AND ASSOCIATED CIRCUITRY
Filed Nov. 16, 1966

INVENTOR
Richard L. Longini
BY
C. L. Menzemer
ATTORNEY 3,480,802
HIGH POWER SEMICONDUCTOR CONTROL ELEMENT AND ASSOCIATED CIRCUITRY Richard L. Longini, Pittsburgh, Pa., assignor to Westinghouse Electric Corporation, Pittsburgh, Pa., a corporation of Pennsylvania Filed Nov. 16, 1966, Ser. No. 594,894
Int. Cl. H03k 3/26, 19/08, 23/22
U.S. Cl. 307—299 2 Claims

ABSTRACT OF THE DISCLOSURE

This disclosure relates to a four-region three junction semiconductor device which is functionally two transistors in tandem. In the device of this disclosure, base current for one transistor is provided by the injection of carriers into the base by means of the other transistor.

This invention relates to transistor structures which can be operated at higher voltages and currents than are possible with conventional transistor constructions. More particularly, the invention relates to a transistor structure in which the current-carrying capacity of the device is not severely limited by self-biasing or crowding effects in the base of the device.

As is known, most semiconductor devices utilized for high power control applications comprise controlled rectifiers (i.e. thyristors) which have similarities in performance to thyratrons. As such, they cannot be readily turned off or modulated by application of a gate current.

While a conventional transistor can be turned off and modulated by application of base current, its current-handling capability is limited. This is due, primarily, to the internal self-bias or crowding effect in the base region of the transistor. That is, since the base region of a transistor has a finite sheet resistance, there results a finite voltage drop associated with the flow of base current, the drop being greatest at points furthest away from the base contact. Since the external emitter bias voltage may be assumed to be applied uniformly over the entire emitter junction, the effect of the internal base voltage is to reduce the potential applied to those portions of the emitter junction furthest away from the base contact. The net effect is that the injected emitter current density is maximum closest to the base contact, and decreases toward the center of the transistor. Thus, there occurs the aforesaid self-bias or crowding effect in the base region of a junction transistor; and this may be interpreted to be a reduction in the active cross-sectional area of the device. From the point of view of practical transistor design, base layer crowding effects can be taken into consideration by simply assuming that only the periphery of the emitter is active, meaning that the current-handling capacity of the transistor becomes proportional to the emitter perimeter rather than the emitter area. This effect is accentuated by virtue of the fact that the emitted carriers at the perimeter find themselves near the external surface of the base. These surfaces act as very rapid recombination centers, thus reducing greatly the probability of the minority carriers ever reaching the collector. The recombination at the surface adds considerably to the base drop and to the transistor inefficiency.

As an overall object, the present invention provides a transistor structure which essentially eliminates the peripheral crowding effects of conventional transistor designs, whereby the current-handling capability of the device is greatly increased.

Another object of the invention is to provide a power transistor structure wherein base current for the transistor is provided by injecting carriers into the base by means of a second transistor assembly in which the base of the main power transistor is the emitter, and the collector of the main transistor is the base.

In accordance with the invention, a wafer of semiconductive material is provided having a first region of one conductivity type situated between second and third regions of the opposite conductivity type, in combination with a fourth or auxiliary region of material of the conductivity type of said first region and forming a P-N junction with the second region. Means are provided for connecting a source of driving potential and a load in series with leads to the second and third regions, while a circuit is included for applying a control potential between the fourth and third regions. When a control potential is applied between the third and fourth regions, minority carriers are injected into the third region and, by diffusion and drift, arrive at the junction between the third and first regions where they are collected. This supplies the majority carriers needed to bias the second region-first region junction in the forward direction and balances injected minority carriers, thus permitting a current from the source of driving potential to flow through the primary transistor structure comprising said second, first and third regions. Thus a four-layer device is provided consisting, essentially, of a power transistor structure and a control transistor structure in which the intermediate two layers are common to both transistor structures. Furthermore, their junction acts as the collector of both structures.

The above and other objects and features of the invention will become apparent from the following detailed description taken in connection with the accompanying drawings which form a part of this specification, and in which:

FIGURE 1 is a partially broken-away isometric view of a transistor constructed in accordance with the teachings of the invention;

FIG. 2 schematically illustrates the operation of the transistor of FIG. 1;

Figures 1, 2, 3, 4, 5:
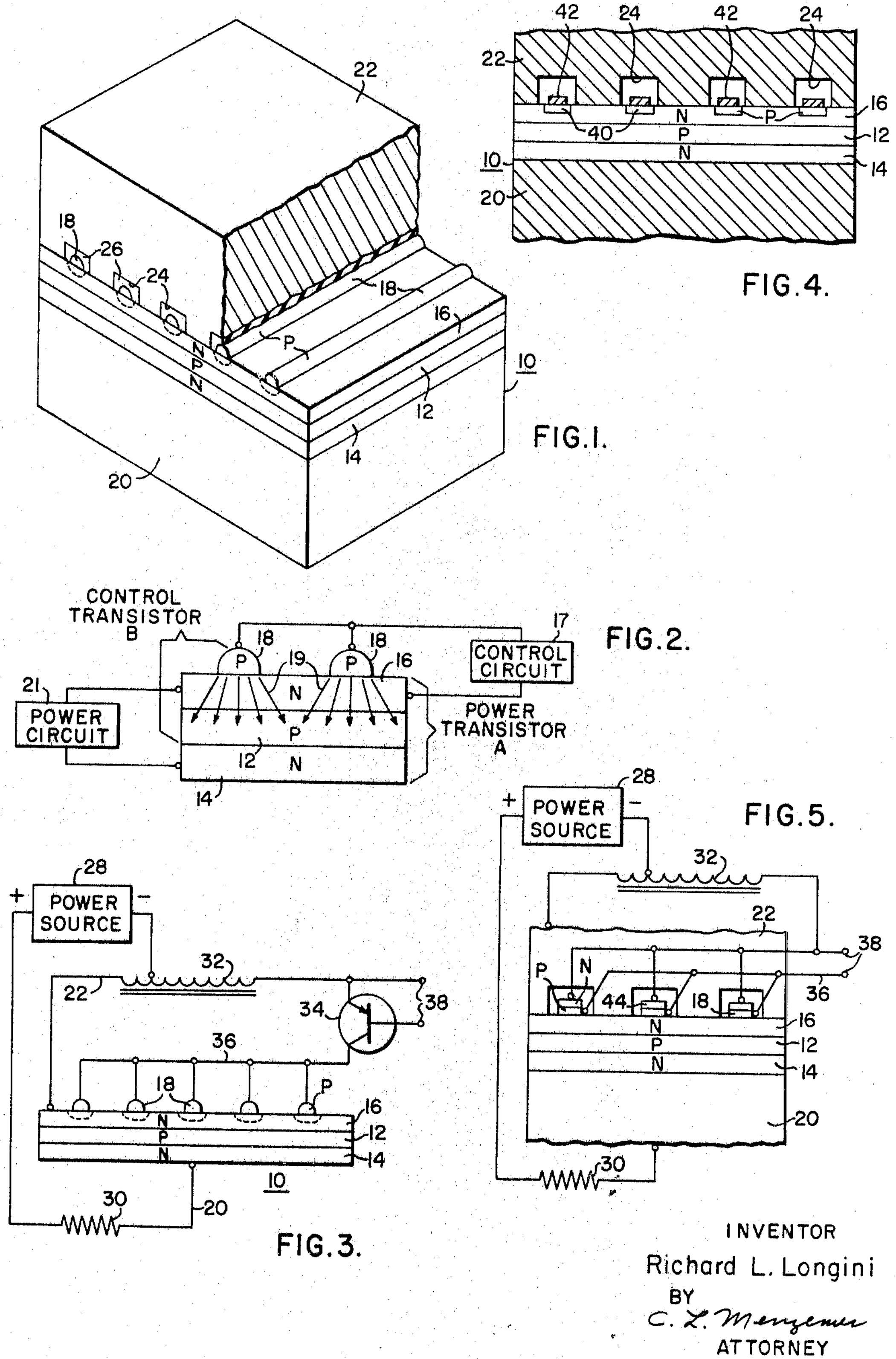
FIG. 3 is a schematic circuit diagram of the transistor of the invention showing in detail its load and control circuits.
FIG. 4 is a schematic diagram of an alternative embodiment of the invention.
FIG. 5 illustrates still another embodiment of the invention.

With reference now to the drawings, and particularly to FIG. 1, the structure shown comprises a wafer 10 of semiconductive material, such as silicon, of P-type conductivity and having N-type regions diffused into its opposite sides. The resulting transistor construction, therefore, includes a P-type base 12, an N-type emitter 14 and an N-type collector 16. Superimposed over the N-type collector 16 are strips 18 which are alloyed to the N-type collector 16. The strips 18, for example, may comprise gold doped with a P-type impurity such as boron. Alternatively, they may comprise aluminum, or an aluminum-silicon eutectic, with or without boron. These strips are alloyed into the transistor structure so as to produce a P-type recrystallized region beneath it.

In contact with the underside of the emitter 14 is a first heavy metallic electrical conductor 20; and in contact with the collector 12 between the strips 18 is a second heavy metallic conductor 22. Slots 24 are provided in the underside of the conductor 22. The strips 18 pass through the slots 24 and are separated from the conductor 22 by means of suitable electrical insulation 26.

As is shown schematically in FIG. 2, the resulting transistor assembly is a four-layer device in which the regions 14, 12 and 16 comprise a power transistor A for high voltage and current loads; while the P-type strips 18 act as an emitter for a second or control transistor B for which the collector 16 of transistor A now becomes the base of transistor B, and base 12 of transistor A now becomes the collector of transistor B. Upon application of a forward biasing potential between the P-type and N-type regions 18 and 16 by means of a control circuit 17, holes from layer 18 will pass along the direction of arrows 19 from layer 18 to layer 16 and then diffuse into layer 12 which comprises the base of the power transistor A. Consequently, minority carriers are injected into the base of the transistor section A such that current from a power circuit 21 will now flow through layers 14, 12 and 16. Note that the power transistor section A has no base contact. The majority carriers constituting a base current for A are brought in through the transistor action of B and are collected by the layer 12 substantially away from any of its edges. Hence, the peripheral self-bias or crowding effect of conventional transistors is greatly reduced as (1) surface recombination is eliminated and (2) the strips 18 can be closely enough spaced so that no substantial lateral drops in potential take place. Furthermore, the power-handling capability of the device is greatly increased.

With reference to FIG. 3, the conductors 20 and 22, schematically illustrated as leads, are connected in series with a high voltage power source 28 and a load, illustrated as resistor 30. Between the lead 22 and power source 28 is a portion of a balance coil 32, the opposite end of the balance coil being connected to the emitter of a control transistor 34. The collector of this same control transistor 34 is, in turn, connected through lead 36 to the P-type strips 18. As shown by the broken lines, the P-type strips 18 are alloyed relatively deeply into the N-type region 16 such that the effective base thickness of the PNP control transistor section 18, 16, 12 will not be too great although it will be far greater than conventional communications transistors. Connected to the base and emitter of the control transistor 34 are input terminals 38 to which a control signal can be applied to turn on transistor 34 and, hence, turn on the main power transistor section 16, 12, 14.

When the transistor 34 turns on in response to an input control signal, the potential on region 16 will be more negative than that on the strips 18. Consequently, the auxiliary control transistor formed from elements 18, 16, 12 will be biased in the forward direction such that holes from the P-type region 18 go into the N-type region 16 and diffuse over to the P-type region 12. Thus, most carriers injected by virtue of the control current will get to the base region 12 of the high current level NPN structure 14, 12, 16. The base thickness of the PNP auxiliary transistor structure 18, 16, 12 should not be so thin that the injected carriers are collected almost straight through from their point of injection but rather it should be thick enough to allow for lateral diffusion of the carriers before collection. That is, it is desirable that the spreading be large such that the base 12 be directly activated over as large a portion of its area as possible.

The injected carriers from the PNP auxiliary control section 18, 16, 12 will spread especially if its $\alpha_C$ is less than about 0.8, $\alpha$ being a measure of the efficiency of transport of carriers through the transistor structure and defined here as the ratio of the collector current to the emitter current, or the DC current gain for common base operation. The power NPN unit 14, 12, and 16 should have an $\alpha_P$ of about 0.9. The control current must then be equal to the emitter current of the power unit times $$\frac{1-\alpha_P}{\alpha_C}$$

or, in this case, one-eighth of $I_P$. Even the 0.9 value for $\alpha_P$ will permit considerable lateral spreading in the base of the power stage.

It is apparent from the foregoing that the two transistor units form a four-layer array with one of the central elements acting as a control. Furthermore, the sum of the alphas is much greater than 1. Though these are direct current alphas their sum is sufficiently greater than unity to insure that the sums of the alternating current alphas are also greater than unity. While it might be suspected that such a device is unstable, actually the $\alpha_C$ and $\alpha_P$ values conventionally used in transistors are not appropriate to the four-layer array. That is, the $\alpha_P$ in this case has to do with the entire area rather than that which would be collected by only the control portion. Furthermore, the $\alpha_C$ includes injected carriers which are purposely made to diverge from the control area such that the four-layer alpha appropriate to this is also much less than $\alpha_C$. Thus, the four-layer array will be well within its stability range and can be used for modulation control. This would be true even if its current flow were not directly controlled by a series element. Such control insures stability regardless of the alphas.

The balance coil 32 is used such that the current will be divided according to design. If too little current passes through the control portion, the voltage on the power portion will build up. Since impedance changes sometimes cause surges of unpredictable amplitude, it is important to use the balance coil to permit them to pass without voltage buildup.

One point of distinction between the power transistor section 14, 12, 16 and a conventional transistor should be emphasized. The base current in this case is injected through the collector instead of being conducted laterally as in a conventional unit. As a result, an electric field in the base carries the majority carriers throughout the base to the emitter region, and this same electric field acts to carry the base minority carriers to the collector. This field enhancement of the current can greatly increase the alpha values at high current levels.

Another point of distinction is that, compared to a thyristor, very little heat is generated in the base region of this device as recombination current effects there are small. The minority carriers mostly are removed from the base by the collector. Still another point is that the control elements 18 have a low voltage relationship to the collector 16 of the main power device rather than to the emitter 14 as do the controls in normal transistors. As will be appreciated by the circuit engineer, this has many circuit advantages.

Thus, the device shown in FIGS. 1–3 provides, firstly, a means whereby the current-handling capability of a power transistor is not limited to internal self-biasing or crowding effects in the base region of the transistor, which would otherwise result in recombination currents at the edge of the base. This is achieved by injecting minority carriers directly into and over essentially the entire surface area of the base region, rather than by means of a lead connected to the base as is the practice with conventional transistors. Secondly, by modifying the control system, a low voltage is obtained between collector and control rather than between emitter and control.

With reference, now, to FIG. 4, another embodiment of the invention is shown in which elements corresponding to those of FIG. 1 are identified by like reference numerals. Again, the device includes a wafer of semiconductor material 10 having a lower N-type emitter layer 14, an intermediate P-type base layer 12 and an upper N-type collector layer 16. The contacts 20 and 22 are, as in the embodiment of FIG. 1, in engagement with the upper and lower surfaces of the wafer 10, the contact 22 having slots 24 therein. In this case, however, strips are not alloyed to the collector layer 16 to form the fourth P-type region. Rather, P-type areas 40 are diffused into the layer 16 and covered by ohmic contacts 42. The contacts 42, in turn, will be connected to a lead corresponding to lead 36 shown in FIG. 2.

The diffusion into the upper N-type collector layer 16 to form the P-type areas 40 may be carried out in accordance with conventional diffusion techniques wherein the entire wafer is covered with a layer of silicon dioxide, and windows opened in the oxide mask above the areas to be diffused. The masked wafer may, for example, then be heated in an atmosphere containing hydrogen and boron trichloride, whereby elemental boron will react with the wafer in the areas of the windows in the mask. Subsequent heating causes the boron to diffuse into the wafer to the desired extent. Again, the diffusion extends down into the N-type layer 16 such that the effective base thickness of the PNP structure will not be too great.

With reference now to FIG. 5, still another embodiment of the invention is shown wherein elements corresponding to those shown in FIGS. 1 and 3 are again identified by like reference numerals. In this case, however, N-type layers 44 are superimposed over the previously-alloyed P-type layers 18. The N-type layers 44 are connected directly to one end of the balancing coil 32, while the lower P-type layers 18 are connected to lead 36 which, in turn, is now connected directly to one of the input terminals 38. Upon application of a suitable biasing potential to the input terminals 38, the junction between layers 18 and 44 will break down, whereby holes will again be injected into the N-type layer 16 and diffused into the P-type layer 12, thereby initiating conduction through the main NPN transistor structure.

Although the invention has been shown in connection with certain specific embodiments, it will be readily apparent to those skilled in the art that various changes in form and arrangement of parts may be made to suit requirements without departing from the spirit and scope of the invention. In this respect, it will be appreciated that the P-type and N-type regions shown herein can be interchanged to produce a PNP main power transistor section and an NPN control section with the same overall effect.

I claim as my invention:

1. A high power semiconductor device comprising a semiconductor wafer having a first region of a first conductivity type between second and third regions of a second opposite conductivity type, a fourth region of material of said first conductivity type forming a junction with said second region, means connecting a source of driving potential and a load across said second and third regions, means for applying a control potential between said fourth and third regions whereby minority carriers will be injected into the device and will be collected by and will alter the potential of said first region to cause current from said source of driving potential to flow through said first, second and third regions, a balancing coil, an additional control transistor having its collector connected to said fourth region and its emitter connected to one end of said balancing coil, means connecting the other end of the balancing coil to said second region, means connecting a point intermediate the ends of the balancing coil through said source of driving potential and said load to said third region, and means for applying a control signal between the base and emitter of said additional control transistor.

2. A high power semiconductor device comprising a semiconductor wafer having a first region of a first conductivity type between second and third regions of a second conductivity type, a fourth region of material of said first conductivity type forming a junction with said second region, means connecting a source of driving potential and a load across said second and third regions, means for applying a control potential between said fourth and third regions whereby minority carriers will be injected into the device and will be collected by and will alter the potential of said first region to cause current from said source of driving potential to flow through said first, second and third regions and a fifth region of material of said second conductivity type superimposed over said fourth region, a balancing coil, means connecting one end of said balancing coil to said fifth region, means connecting the other end of said balancing coil to said second region, means connecting a point intermediate the ends of the balancing coil to said third region through said driving potential source and said load, and means for applying a control signal between said fourth and fifth regions.

References Cited

UNITED STATES PATENTS

| | | | |
|---|---|---|---|
| 3,404,327 | 10/1968 | Gutzwiller | 321—8 |
| 3,386,026 | 5/1968 | Gutterman | 321—8 |
| 2,995,473 | 8/1961 | Levi | 117—201 |
| 3,046,405 | 7/1962 | Emeis | 317—235 X |
| 2,655,610 | 10/1953 | Ebers | 307—88 |
| 3,193,737 | 7/1965 | Swanson | 317—234 |
| 3,312,880 | 4/1967 | Longo | 317—235 |

JOHN W. HUCKERT, Primary Examiner

B. ESTRIN, Assistant Examiner

U.S. Cl. X.R.

307—303, 305; 317—235